(12) United States Patent
Takeuchi et al.

(10) Patent No.: US 6,366,490 B1
(45) Date of Patent: Apr. 2, 2002

(54) SEMICONDUCTOR MEMORY DEVICE USING FERROELECTRIC FILM

(75) Inventors: Yoshiaki Takeuchi; Yukihito Oowaki, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/879,054

(22) Filed: Jun. 13, 2001

(30) Foreign Application Priority Data

Aug. 23, 2000 (JP) ............................................ 12-251853

(51) Int. Cl.⁷ .............................................. G11C 11/22
(52) U.S. Cl. .................................... 365/145; 365/230.03
(58) Field of Search ................................ 365/145, 149, 365/230.03

(56) References Cited

U.S. PATENT DOCUMENTS

| | | |
|---|---|---|
| 5,400,275 A | 3/1995 | Abe et al. |
| 5,903,492 A | 5/1999 | Takashima |
| 2001/0015906 A1 * | 8/2001 | Schneider et al. ............ 365/145 |
| 2001/0021120 A1 * | 9/2001 | Oowaki ....................... 364/145 |

* cited by examiner

Primary Examiner—Son Mai
(74) Attorney, Agent, or Firm—Banner & Witcoff, Ltd.

(57) ABSTRACT

This invention is such that, in a series-connected TC parallel-unit type ferroelectric RAM composed of a series connection of a plurality of unit cells, each unit cell being such that a ferroelectric capacitor is connected between the source and drain of a cell transistor, for instance, plate electrode wires are provided in the longitudinal direction of bit line pairs. The plate electrode wires are shared in memory block groups, each group being a set of a plurality of memory cell blocks connected to the same bit line pair. This causes only the memory cells read from or written into to be accessed by the selected word line and selected plate electrode wire in one select operation.

20 Claims, 11 Drawing Sheets

SEMICONDUCTOR MEMORY DEVICE USING FERROELECTRIC FILM

CROSS-REFERENCE TO RELATED APPLICATIONS

This application is based upon and claims the benefit of priority from the prior Japanese Patent Application No. 2000-251853, filed Aug. 23, 2000, the entire contents of which are incorporated herein by reference.

BACKGROUND OF THE INVENTION

This invention relates to a semiconductor memory device using a ferroelectric film. More particularly, this invention relates to a series-connected TC parallel-unit type ferroelectric RAM (Random Access Memory) composed of a series connection of a plurality of unit cells, each unit cell being such that a ferroelectric capacitor (C) is connected between the source and drain of a cell transistor (T).

It is common knowledge that ferroelectric memories are nonvolatile, like flash memories, and have the ability to effect high-speed access and high-speed rewriting, like DRAMs. Furthermore, the ferroelectric memory is capable of operating on a lower voltage and consuming less power than the flash memory. That is, although being a nonvolatile device, the ferroelectric memory has the advantages of achieving a larger number of rewrites and a shorter write time and being capable of operating on a lower voltage and consuming less power.

The cell structure of the ferroelectric memory has been generally developed using a one-transistor one-capacitor cell.

Figure 9:
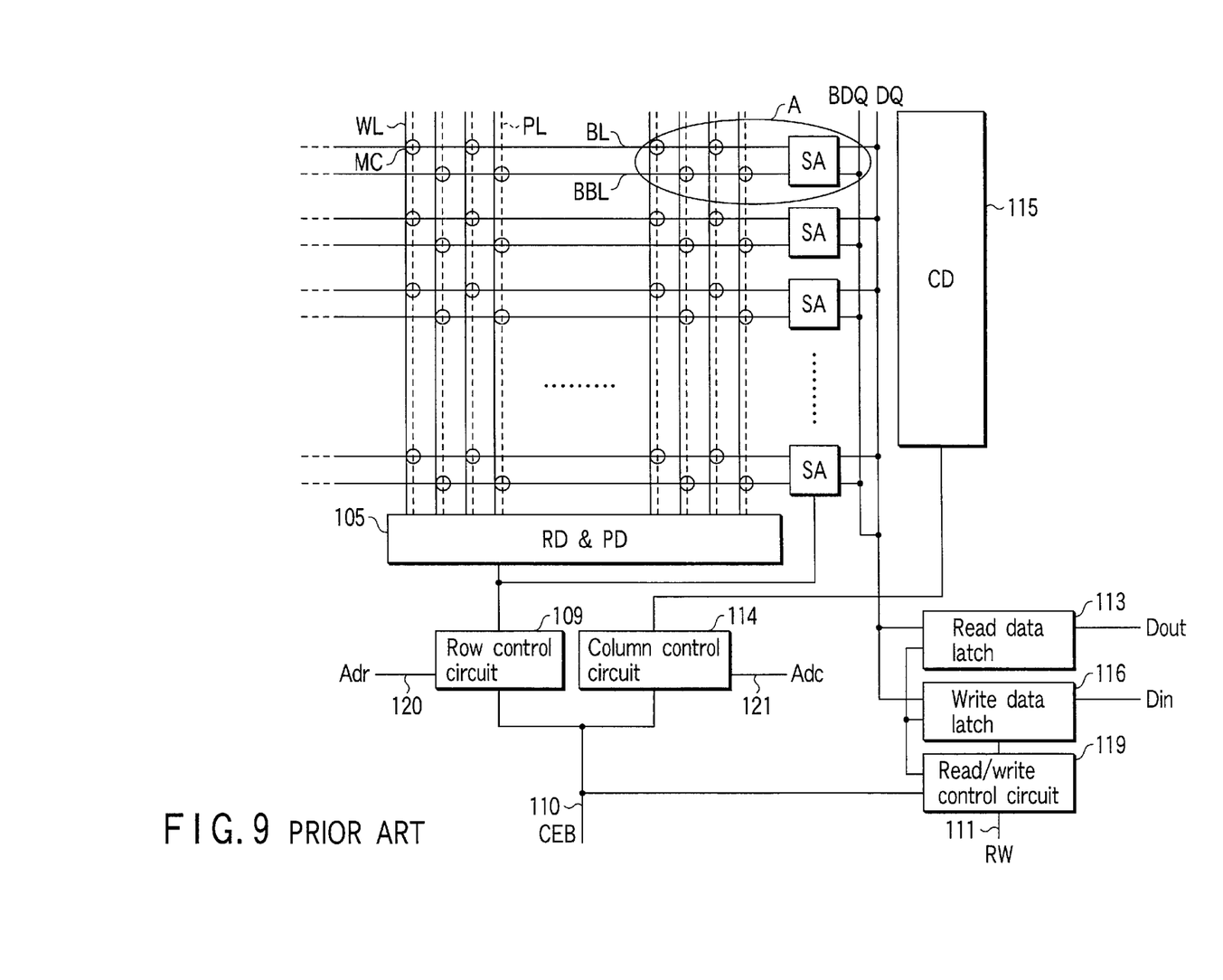
FIG. 9 shows the configuration of a ferroelectric memory to help explain the prior art and its problem.

In a conventional ferroelectric memory of FIG. 9, a plurality of memory cells MCs are placed at the intersections of word lines WLs and pair of bit lines (bit line pairs) BLs, BBLs complementary to each other, the word lines crossing at right angles with the bit line pairs, in such a manner that they are located at every other intersection. A plate electrode wire PL is placed in parallel with each of the word lines WL. Each of the plate electrode wires PLs and each of the word lines WLs are controlled by a row decoder/plate electrode wire driving circuit (RD & PD) 105 controlled according to row addresses.

Each of the bit line pairs BLs, BBLs is controlled by a sense amplifier SA controlled according to row addresses. That is, each sense amplifier SA amplifies the data read onto a pair of bit lines BL, BBL.

The read or write data is inputted or outputted via a pair of data lines (data line pair) DQ, BDQ complementary to each other.

The row decoder/plate electrode wire driving circuit 105 is controlled by a row control circuit 109.

The row decoder circuit 109 is controlled on the basis of a chip enable signal CEB transmitted over a chip enable signal wire 110 and a row address signal Adr transmitted over a row address signal wire 120.

A column decoder (CD) 115 is controlled on the basis of the output of a column control circuit 114. The column control circuit 114 is controlled on the basis of the chip enable signal CEB and a column address signal Adc transmitted over a column address signal wire 121.

A read/write control circuit 119 is controlled by the chip enable signal CEB and a read/write signal RW transmitted over read/write signal wires 111. A read data latch 113 and a write data latch 116 are controlled by the read/write control circuit 119. The read data latch 113 and write data latch 116 are connected to the pair of data lines DQ, BDQ, respectively. The read data latch 113 outputs an output signal (read data) Dout. An input signal (write data) Din is inputted to the write data latch 116.

Figure 10:
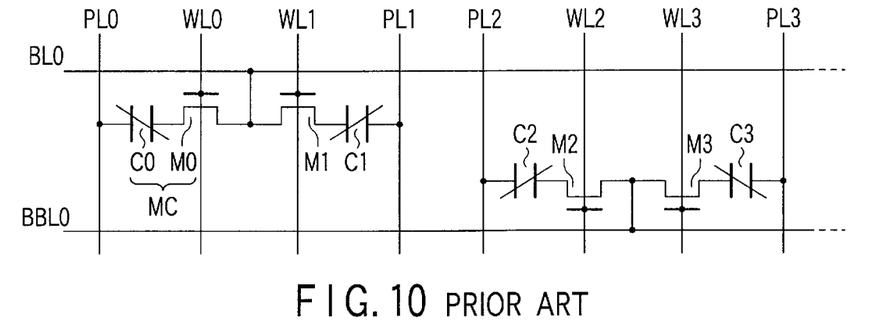
FIG. 10 is a circuit diagram showing the main part of the memory cell array of the ferroelectric memory shown in FIG. 9.

FIG. 10 shows, in further detail, the circuit configuration of the part indicated by A or FIG. 9.

In FIG. 10, for example, four memory cells MCs are placed between bit lines BL0, BBL0 making a pair. Specifically, the gate of a first cell transistor M0 is connected to word line WL0. One electrode of a first cell capacitor C0 is connected to plate electrode wire PL0 and the other electrode of the first cell capacitor C0 is connected to one of the source and drain of the first cell transistor M0. The other of the source and drain of the first cell transistor M0 is connected to bit line BL0.

The gate of a second cell transistor M1 is connected to word line WL1. One of the source and drain of the second cell transistor M1 is connected to bit line BL0. One electrode of a second cell capacitor C1 is connected to plate electrode wire PL1 and the other electrode of the second cell capacitor C1 is connected to the other of the source and drain of the second cell transistor M1.

The gate of a third cell transistor M2 is connected to word line WL2. One electrode of a third cell capacitor C2 is connected to plate electrode wire PL2 and the other electrode of the third cell capacitor C2 is connected to one of the source and drain of the third cell transistor M2. The other of the source and drain of the third cell transistor M2 is connected to bit line BBL0.

The gate of a fourth cell transistor M3 is connected to word line WL3. One of the source and drain of the fourth cell transistor M3 is connected to bit line BBL0. One electrode of a fourth cell capacitor C3 is connected to plate electrode wire PL3 and the other electrode of the fourth cell capacitor C3 is connected to the other of the source and drain of the fourth cell transistor M3.

With this configuration, the plate electrode wires PL0, PL1, PL2, PL3 are provided for the cell capacitors C0, C1, C2, C3, respectively. The plate electrode wires PL0, PL1, PL2, PL3 are provided in the longitudinal direction of the word lines WL0, WL1, WL2, WL3, respectively.

Figure 11:
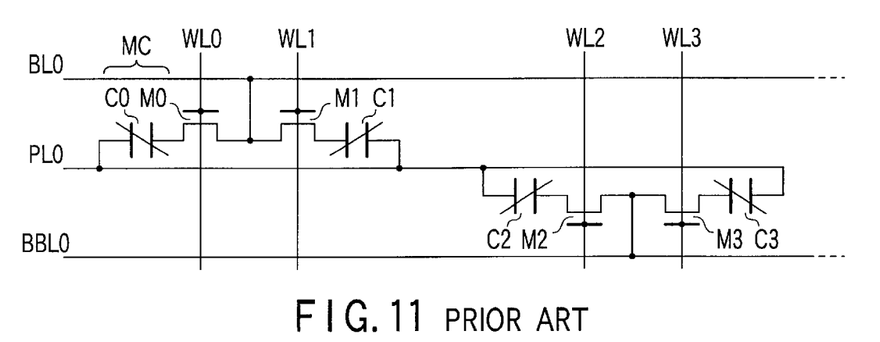
FIG. 11 is a circuit diagram showing the main part of the memory cell array of a conventional ferroelectric memory differing in configuration from that of FIG. 9.

In this connection, a ferroelectric memory with one-transistor one-capacity cells where the plate electrode wires are provided in the longitudinal direction of bit lines has been disclosed in U.S. Pat. No. 5,400,275 (Jpn. Pat. Appln. KOKAI Publication No. 4-42498). In the ferroelectric memory, for example, four memory cells MCs, as shown in FIG. 11, are placed between bit lines BL0, BBL0 making a pair.

Specifically, the gate of a first cell transistor M0 is connected to word line WL0. One electrode of a first cell capacitor C0 is connected to plate electrode wire PL0 and the other electrode of the first cell capacitor C0 is connected to one of the source and drain of a first cell transistor M0. The other of the source and drain of the first cell transistor M0 is connected to bit line BL0.

The gate of a second cell transistor M1 is connected to word line WL1. One of the source and drain of the second cell transistor M1 is connected to bit line BL0. One electrode of a second cell capacitor C1 is connected to plate electrode wire PL0 and the other electrode of the second cell capacitor C1 is connected to the other of the source and drain of the second cell transistor M1.

The gate of a third cell transistor M2 is connected to word line WL2. One electrode of a third cell capacitor C2 is connected to plate electrode wire PL0 and the other electrode of the third cell capacitor C2 is connected to one of the source and drain of a third cell transistor M2. The other of the source and drain of the third cell transistor M2 is connected to bit line BBL0.

The gate of a fourth cell transistor M3 is connected to word line WL3. One of the source and drain of the fourth cell transistor M3 is connected to bit line BBL0. One electrode of a fourth cell capacitor C3 is connected to plate electrode wire PL0 and the other electrode of the fourth cell capacitor C3 is connected to the other of the source and drain of the fourth cell transistor M3.

In this configuration, a single plate electrode wire PL0 is provided in-parallel with and between bit lines BL0, BBL0 making a pair.

With this configuration, data is read from or written into only the memory cell MC at the intersections of the word lines WL0, WL1, WL2, WL3 set at the high level and plate electrode wire PL0 driven to the high level. In this way, by reducing the number of accessed cells, the operating current can be decreased.

Although such a configuration reduces the frequency of access to the memory cells MC and the current drawn, a new problem is expected to arise: read disturb will take place. Read disturb is a phenomenon in which a cell transistor decreases the data accumulated in a memory cell (half-selected) MC which is off and eventually destroys the data.

Figure 12:
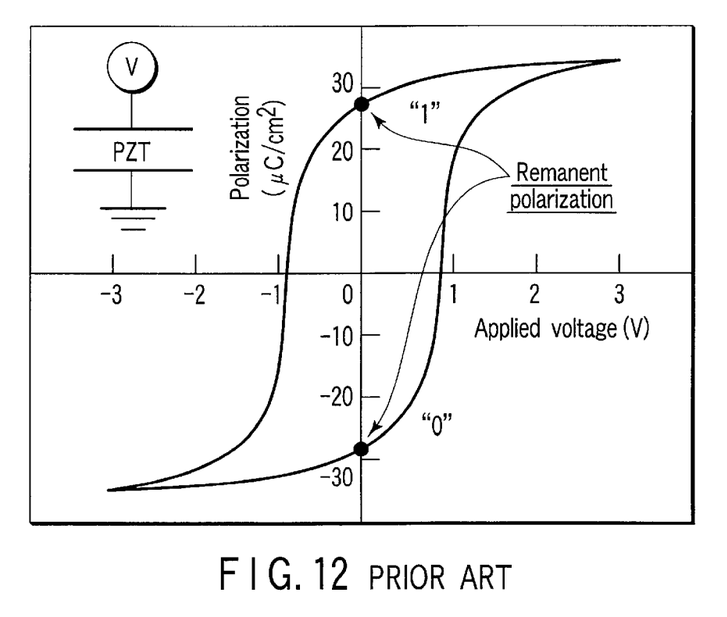
FIG. 12 is a diagram showing a hysteresis curve to help explain the operation of a conventional ferroelectric memory.

Hereinafter, referring to FIGS. 11 and 12, read disturb will be explained.

Using a hysteresis curve in FIG. 12, the read operation of a ferroelectric memory will be explained. For example, when no voltage is applied to a PZT (lead zirconate titanate ($PbZrTiO_3$)) film, known as a ferroelectric film, it is in the polarized state (remanent polarization) of either an upward direction or a downward direction denoted by "0" or "1" in the figure and makes a nonvolatile memory.

When a voltage is applied to the polarized PZT film, if it is in the "1" s state, the polarization is not reversed. If it is in the "0" state, the polarization is reversed. In these two cases, the amount of charge required to apply the same voltage (that is, when the same voltage is applied to one of the PZT film, the amount of charge generated at the other end of the PZT film) in the "0" state differs from that in the "1" state. By sensing the voltage difference, the data is read in the ferroelectric memory.

It is assumed that, in FIG. 11, plate electrode wire PL0 is driven with word line WL0 at the high level and word line WL1 at the low level. In addition, it is assumed that cell capacitor C1 connected to word line WL1 is in the "1" state, that is, in the downward polarized state. Then, even if plate electrode wire PL0 is driven, cell transistor M1 remains off because word line WL1 is closed. Consequently, no voltage difference appears at both ends of cell capacitor C1.

When the state is continued for a length of time, however, the potential at the node on the cell transistor M1 side drops because of a junction leak. Then, a potential difference appears at both ends of cell capacitor C1, which decrease the data accumulated in the cell MC and eventually destroys the data.

The following is an explanation of a ferroelectric memory capable of improving high-speed operation and high integration. For instance, U.S. Pat. No. 5,903,492 (Jpn. Pat. Appln. KOKAI Publication No. 10-255483) has disclosed a ferroelectric memory (series-connected TC parallel-unit type ferroelectric RAM) composed of a series connection of a plurality of unit cells, each unit cell being such that both electrodes of a cell capacitor (C) are connected to the source and drain of a cell transistor (T), respectively.

Figure 13:
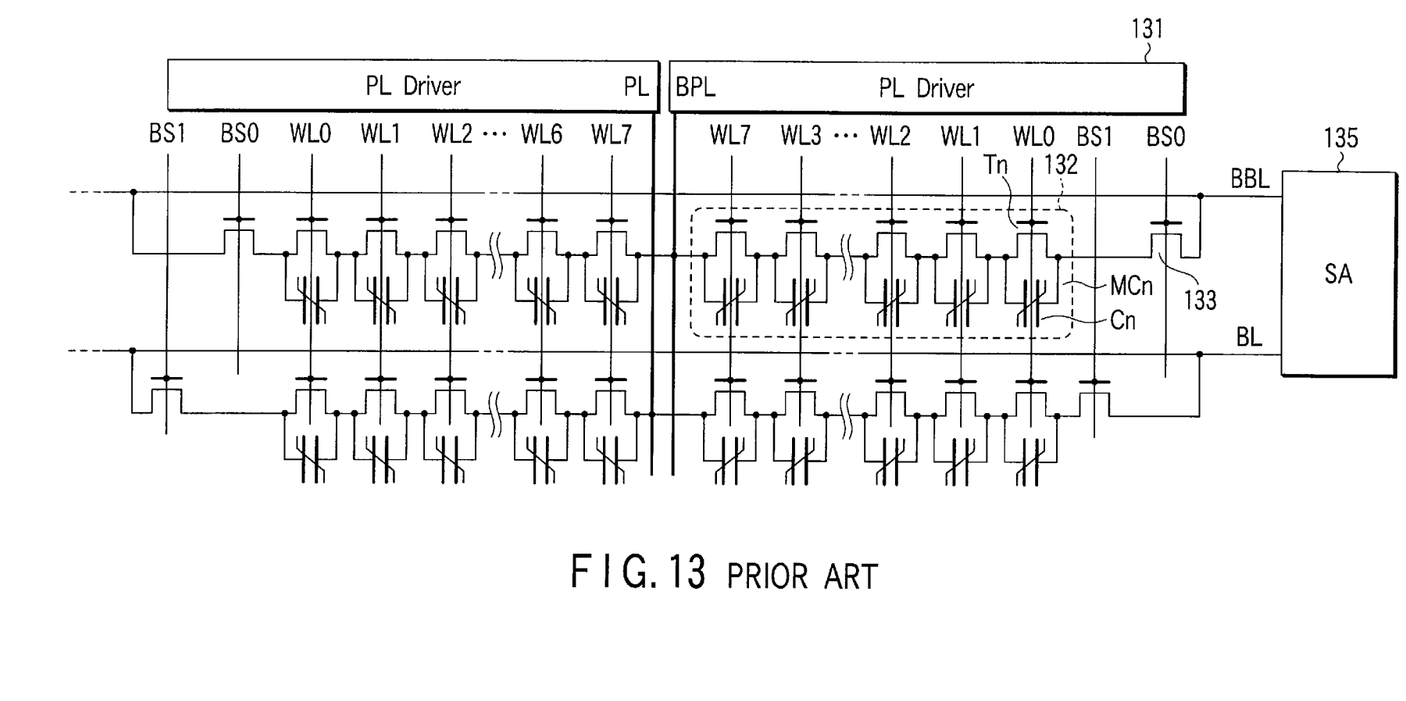
FIG. 13 is a circuit diagram showing the main part of the memory cell array of a conventional series-connected TC parallel-unit type ferroelectric RAM.

For example, in the series-connected TC parallel-unit type ferroelectric RAM, a plurality of memory cell blocks 132 share a pair of plate electrode wires PL, BPL (plate electrode wire pair) complementary to each other provided along the word lines WLn (n=0, 1, 2, . . . , 7) and a driving circuit 131 for driving the plate electrode wire pair of PL, BPL as shown in FIG. 13. With this configuration, the number of plate electrode wire pairs of PL, BPL and driving circuits 131 is decreased, thereby realizing a reduction in the chip size.

In the configuration of FIG. 13, each memory cell block 132 is composed of a series connection of a plurality of memory cells MCn (n=0, 1, 2, . . . , 7), each made up of a cell transistor Tn (n=0, 1, 2, . . . , 7) and a cell capacitor Cn (n=0, 1, 2, . . . , 7). The gate of each cell transistor Tn in the memory cell block 132 is connected to the corresponding word line WLn.

One end of each memory cell block 132 is connected to the corresponding plate electrode wire pair of PL, BPL. The other end of each memory cell block 132 is connected to one of the source and drain of the corresponding block select transistor 133. The gate of the block select transistor 133 is connected to any one of the block select lines BS0, BS1 forming a pair complementary to each other (block select line pair). The other of the source and drain of each block select transistor 133 is connected to the corresponding bit line pair of BL, BBL. A sense amplifier (SA) 135 is connected to the bit line pair of BL, BBL.

The plate electrode wire pair of PL, BPL is driven by a plate electrode wire driving circuit 131. Each plate electrode wire driving circuit 131 drives a plurality of memory cell blocks 132 connected to the same plate electrode wire pair of PL, BPL.

Although only two plate electrode wire driving circuits 131 are shown in FIG. 13, there are as many plate electrode wire driving circuits 131 as there are memory cell blocks 132 placed in the longitudinal direction of the bit line pair of BL, BBL. Each plate electrode wire driving circuit 131 is designed to supply different plate electrode wire driving signals to each of the plate electrode wire PL, BPL making a pair.

The word line (selected word line) WLn connected to the gate of the cell transistor Tn of the selected memory cell (selected cell) MCn goes to the low level. The remaining word lines (unselected word lines) WLn go to the high level. In this way, only the cell transistor Tn of the selected cell MCn turns off, applying a potential to both ends of the cell capacitor Cn connected in parallel with the cell transistor Tn.

The block select line pair of BS0, BS1 connected to the gate of the block select transistor 133 connected to the memory cell block 132 including the selected cell MCn goes to the high level. As a result, the memory cell block 132 is connected to the bit line pairs of BL, BBL.

Furthermore, the plate electrode wires PL, BPL connected to the memory cell block 132 including the selected cell MCn go to the high level. Then, the data is read or written from or into the memory cell MCn selected between the plate electrode wire pair of PL, BPL and the bit line pair of BL, BBL.

In contrast, the cell transistor Tn of the unselected cell MC turns off. In this case, the same potential is applied to both ends of the cell capacitor Cn of the unselected cell MC. This prevents the data from being read or written from or into the unselected cell MCn.

The above-described conventional series-connected TC parallel-unit type ferroelectric RAM has the following problem.

Although the ferroelectric RAM of FIG. 13 is capable of improving high-speed operation and high integration, it has basically the same number of cells accessed in selecting one word line as a conventional equivalent does.

Specifically, when plate electrode wires are provided along the word lines, one plate electrode wire is selected (or activated) each time a word line is selected. As a result, all the memory cells connected to the selected word line are accessed at the same time. Consequently, the average frequency of access and drawn current in reading or rewriting the data are basically the same as those of a conventional ferroelectric memory. This causes a problem: the number of rewrites increases and it is difficult to reduce power consumption. Particularly in a series-connected TC parallel-unit type ferroelectric RAM, all the driving circuits for the plate electrode wires along the word lines and all the sense amplifiers have to be driven, which makes the power consumption large.

BRIEF SUMMARY OF THE INVENTION

An object of the present invention is to provide a semiconductor memory device capable of reducing the number of accessed memory cells and the power consumption.

Another object of the present invention is to provide a semiconductor memory device capable of preventing an half-selected cell from being read from and read disturb from taking place.

The foregoing objects are accomplished by a semiconductor memory device comprising: a plurality of memory cell blocks each of which comprise a series connection of a plurality of memory cells, each cell being such that both electrodes of a ferroelectric capacitor are connected between the source and drain of each cell transistor; a plurality of bit lines each of which is connected to one end of the plurality of memory cell blocks; and a plurality of plate electrode wires each of which is provided in parallel with the plurality of bit lines and connected to the other end of the plurality of memory cell blocks, with the memory cell blocks connected to the same one of the plurality of bit lines being connected to the same one of the plurality of plate electrode wires.

The foregoing object is further accomplished by a semiconductor memory device comprising: a plurality of memory cells having a plurality of cell transistors and a plurality of ferroelectric capacitors each of which is connected between the source and drain of each of the plurality of cell transistors; a plurality of memory cell blocks each of which comprise a series connection of a specific number of those of the plurality of memory cells; a plurality of bit lines each of which is connected via a select transistor to one end of the plurality of memory cell blocks; a plurality of plate electrode wires each of which is provided in parallel with the plurality of bit lines and connected to the other end of the plurality of memory cell blocks; and a plurality of memory block groups each of which comprise a specific number of those of the plurality of memory cell blocks connected to the same plate electrode wire and the same bit line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the inventions

DETAILED DESCRIPTION OF THE INVENTION

Hereinafter, referring to the accompanying drawings, embodiments of the present invention will be explained.

(First Embodiment)

Figure 1:
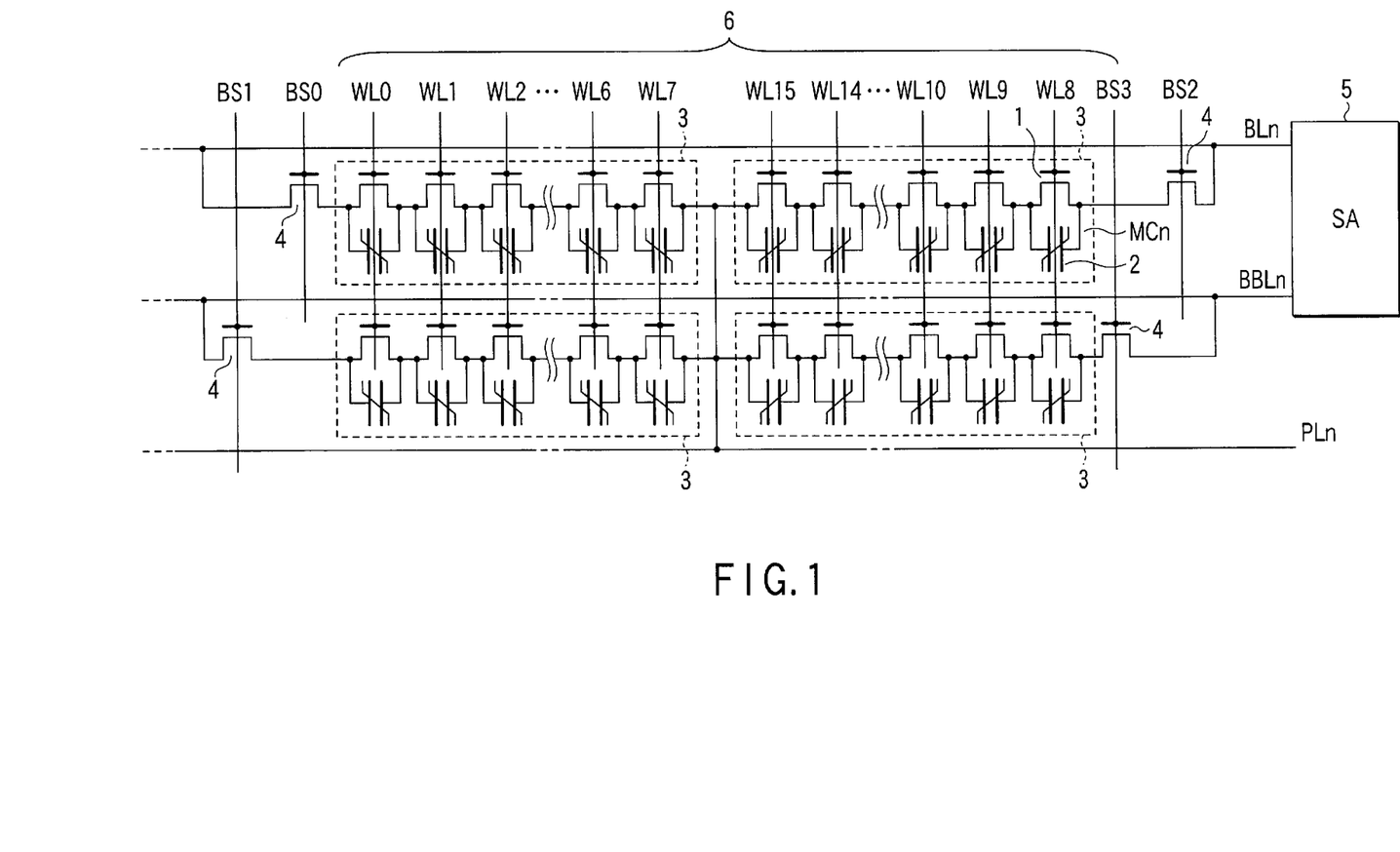
FIG. 1 is a circuit diagram showing the main part of the memory cell array of a series-connected TC parallel-unit type ferroelectric RAM according to a first embodiment of the present invention.

FIG. 1 shows, in detail, the configuration of the main part of the memory array of a ferroelectric memory (series-connected TC parallel-unit type ferroelectric RAM) according to a first embodiment of the present invention.

A ferroelectric memory according to the first embodiment has ferroelectric memory cells (hereinafter, abbreviated as memory cells) MCn (n=0, 1, 2, . . . , 15) at the intersections of word lines WLn (n=0, 1, 2, . . . , 15) and pairs of bit lines (bit line pair) BLn, BBLn (n is a natural number) complementary to each other. Each memory cell MCn is composed of an n-channel cell transistor 1 and a ferroelectric capacitor (cell capacitor) 2 connected between the source and drain of the cell transistor 1.

For example, eight memory cells MC0 to MC7 are connected in series to form a memory cell block 3 and eight memory cells MC8 to MC15 are connected in series to form another memory cell block 3. There are provided a plurality of memory cell blocks 3. One of the source and drain of each select transistor 4 controlled by block select signals BS0, BS1, BS2, BS3 is connected to one end of each memory cell block 3. The other of the source and drain of each select transistor 4 is connected to the corresponding bit line pair of BLn, BBLn. A plate electrode wire PLn (n is a natural number) is connected to the other end of each memory cell block 3. A sense amplifier (SA) 5 is connected to the bit line pair of BLn, BBLn.

In each memory cell MCn, the gate of the cell transistor 1 is connected to the corresponding word line WLn. When word line WLn is at the high level, the cell transistor 1 is in the conducting state. Then, the two electrodes of the cell capacitor 2 connected between the source and drain of the cell transistor 1 are set to the same potential. This brings the cell capacitor 2 into the unselected state. When the word line WLn is at the low level, the corresponding cell transistor 1 goes into the nonconducting state. This brings the cell capacitor 2 connected between the source and drain of the cell transistor 1 into the selected state.

The number of memory cells MCn in one memory cell block 3 may be 16 or any other value. FIG. 1 shows a case where two memory cell blocks 3 are connected to each of the bit lines BLn, BBLn making a pair. Actually, a large number of memory cell blocks 3 are connected to each of bit line pairs of BLn, BBLn in the longitudinal direction of the bit line pairs BLn, BBLn.

A set of memory cell blocks 3 connected to the same bit line pair of BLn, BBLn is called a memory block group 6. The memory block groups 6 are placed in the longitudinal direction of the word line WLn.

On the other hand, the plate electrode wires PLn are provided in the longitudinal direction of the bit line pair of BLn, BBLn. For example, the plate electrode wire PLn is connected to each memory cell block 3 in one memory block group 6 connected to the same bit line pair of BLn, BBLn.

Figure 2:
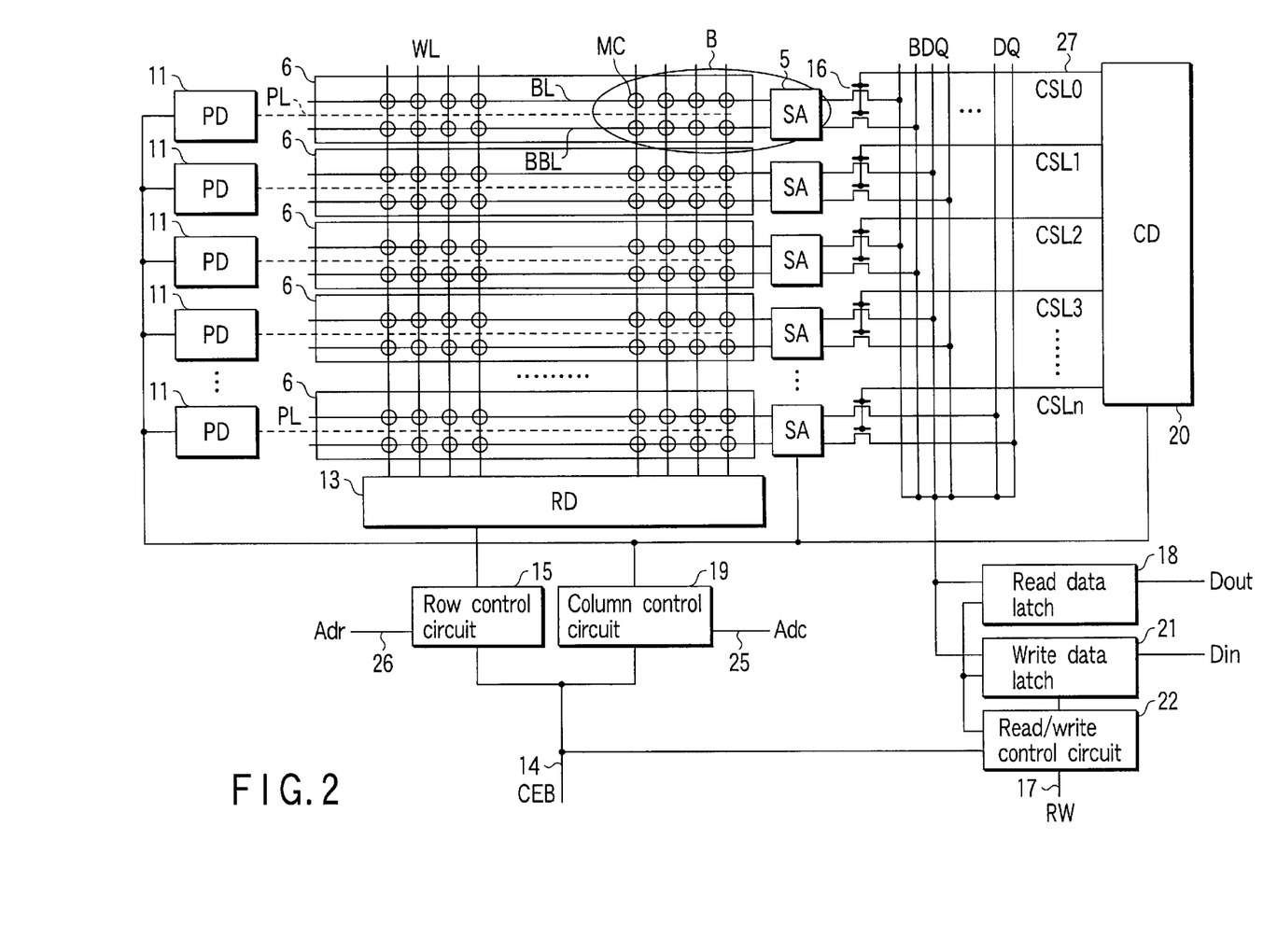
FIG. 2 shows the configuration of a series-connected TC parallel-unit type ferroelectric RAM with the array configuration shown in FIG. 1.

FIG. 2 shows an example of the configuration of the ferroelectric memory according to the first embodiment. The part denoted by B in FIG. 2 almost corresponds to the circuit shown in FIG. 1.

In the ferroelectric memory of the first embodiment, a plurality of memory cells MC are placed at the intersections of a plurality of word lines WL and a plurality of bit line pairs of BL, BBL crossing at right angles, one memory cell at one intersection. A plate electrode wires PL is provided in parallel with each bit line pair of BL, BBL. Each plate electrode wire PL is controlled by a plate electrode wire driving circuit (PD) 11. The plate electrode wire driving circuit 11 is composed of an inverter and buffer. Each bit line pair of BL, BBL is controlled by a sense amplifier (SA) 5. In this case, there are as many sense amplifiers 5 and plate electrode wire driving circuits 11 in the longitudinal direction of the word line WL as there are memory block groups 6.

The read or write data is inputted or outputted via a pair of data lines (data line pair) DQ, BDQ complementary to each other. The data is exchanged with each sense amplifier 5 via the corresponding column select gate 16. The individual column select gates 16 are controlled by column select signals CSLo to CSLn (n is a natural number) transmitted from a column decoder (CD) 20 over column select lines 27.

Each word line WL is controlled by a row decoder (RD) 13. The row decoder 13 is controlled by a row control circuit 15. The row control circuit 15 is controlled on the basis of a chip enable signal CEB transmitted over a chip enable signal line 14 and a row address signal Adr transmitted over a row address signal line 26.

A column control circuit 19 controls the plate electrode wire driving circuit 11, sense amplifier 5, and column decoder 20. The column control circuit 19 is controlled on the basis of the chip enable signal CEB and a column address signal Adc transmitted over a column address signal line 25.

A read/write control circuit 22 is controlled on the basis of the chip enable signal CEB and a read/write signal RW transmitted over a read/write signal line 17. A read data latch 18 and a write data latch 21 are controlled by the read/write control circuit 22. The read data latch 18 and write data latch 21 are connected to the data line pair of DQ, BDQ. The read data latch 18 outputs an output signal (read data) Dout. An input signal (write data) Din is inputted to the write data latch 21.

Figure 3:
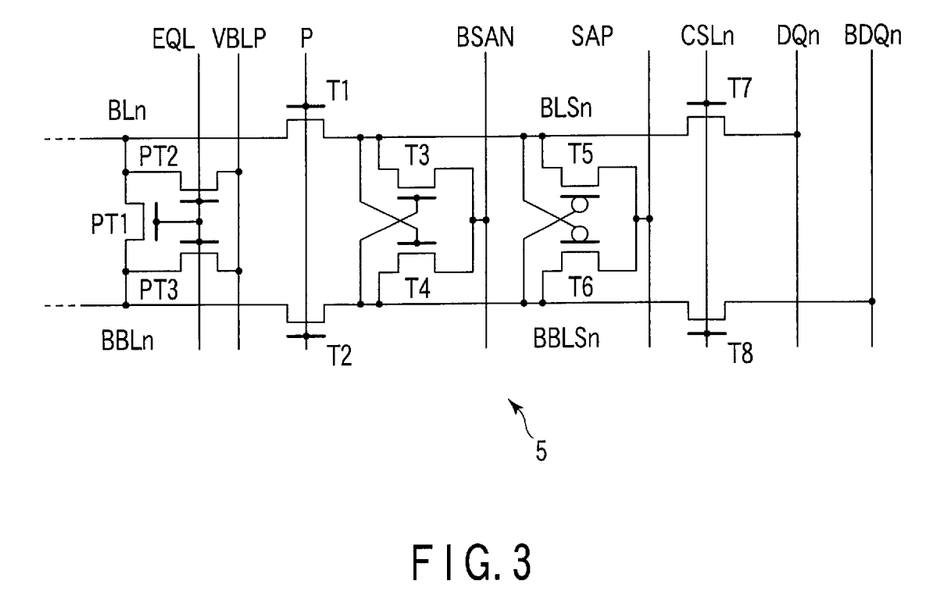
FIG. 3 is a circuit diagram showing an example of the configuration of a sense amplifier used in the series-connected TC parallel-unit type ferroelectric RAM of FIG. 2.

FIG. 3 shows an example of the configuration of the sense amplifier 5 in the ferroelectric memory.

A pair of bit lines BLn, BBLn is connected to each sense amplifier 5. Transistors PT1, PT2, PT3 controlled by an equalizing signal EQL are connected between the bit lines BL, BBLn forming a pair. A first transfer gate section including transistors Ti, T2 controlled by signal P is connected to the bit line pair of BLn, BBLn. Further connected between the bit lines BLn, BBLn making a pair are a first sense section composed of n-channel transistors T3, T4 and a second sense section composed of p-channel transistors T5, T6 and connected in parallel with the first sense section.

Furthermore, a second transfer gate section including transistors T7, T8 controlled by signal CSL is provided in the bit line pair of BLn, BBLn. The transistor T7 is connected to one of data lines DQn, BDQn (n is a natural number) making a pair and the transistor T8 is connected to the other of the data lines DQn, BDQn.

A ferroelectric film used as a ferroelectric capacitor is a PZT (lead zirconate titanate ($PbZrTiO_3$)) film or a SrBiTaO composite film.

In the configuration of FIG. 2, only the plate electrode wire driving circuit 11 and sense amplifier 5 corresponding to the memory block group 6 including the selected memory cell (selected cell) MC are activated by the column control circuit 19. In this case, neither the number of activated plate electrode wire driving circuits 11 nor that of activated sense amplifiers 5 is necessarily limited to one. Each of the activated plate electrode wire driving circuit 11 and sense amplifier 5 has to be connected to the same memory block group 6. If the activated plate electrode wire driving circuit 11 and sense amplifier 5 are connected to different memory block groups 6, the plate electrode wire PL and bit line pairs of BL, BBL for the selected cell MC are not selected at the same time.

With the first embodiment, the plate electrode wires are shared in memory block groups, whereas the plate electrode wires are shared in memory cell blocks in the conventional ferroelectric memory of FIG. 13. This reduces the number of plate electrode wires, which decreases the number of driving circuits for driving the plate electrode wires. As a result, not only is the chip size made smaller, but also the number of cells accessed when one word line is selected is reduced.

Furthermore, the sense amplifiers 5 and plate electrode wire driving circuits 11 are controlled in such a manner that only the sense amplifier 5 and plate electrode wire driving circuit 11 corresponding to the memory block group 6 including the selected cell MC are activated. This reduces not only the read/write fatigue of the memory cells MCs but also the power consumption. For example, it is assumed that the number of bit line pairs of BL, BBL is 32 and the number of sense amplifiers 5 corresponding to them is also 32. In the prior art, all the bit line pairs and sense amplifiers were activated in a read/write operation. In the first embodiment, however, only one bit line pair of BL, BBL and one sense amplifier 5 corresponding to the memory block group 6 including the selected cell MC are activated. As a result, the power consumption can be reduced to about 1/32 of that in the prior art.

Furthermore, since only the memory cell MC to be read from or written into is accessed, the memory cells unrelated to the write/read operation are not unnecessarily accessed. This reduces the sum total of accesses to each memory cell and alleviates the limit to the number of reads/writes.

With the configuration of the first embodiment, read disturb found in a conventional ferroelectric memory can be prevented from occurring. Specifically, in the series-connected TC parallel-unit type ferroelectric RAM of the first embodiment, when word line WL is in the unselected state (standby state), word line WL is placed at the high level, thereby short-circuiting both ends of all the ferroelectric capacitors 2. Therefore, in this state, even when plate electrode wire PL is driven, read disturb in a so-called half-selected cell does not take place at all. Read disturb became a problem when the plate electrode wire PL0 was provided in the longitudinal direction of the bit line pair of BL0, BBL0 as in a conventional one-transistor one-capacitor cell ferroelectric memory.

In a read operation, only the selected word line WL is placed at the low level and the block select signal BS is placed at the high level. Thereafter, the plate electrode wire PL is driven from the low level to the high level. Then, a voltage equivalent to the power supply voltage is applied only across both electrodes of the ferroelectric capacitor 2 of the selected cell MC, thereby reading the data accumulated in the selected cell MC.

As described above, with the first embodiment, the memory cells unrelated to a read/write operation are prevented from being accessed needlessly. This reduces not only the read/write fatigue of the memory cells MC but also the power consumption. Furthermore, the half-selected cells are prevented from being read from, thereby preventing the occurrence of read disturb.

Since the power consumption is reduced remarkably, it is possible to realize a decrease in the power consumption and a lower battery voltage in such products as personal digital assistants provided with a ferroelectric memory according to the first embodiment. Moreover, it is easy to provide a ferroelectric memory for a product which previously was not possible due to restrictions on the number of rewrites and power consumption problems.

(Second Embodiment)

Figure 4:
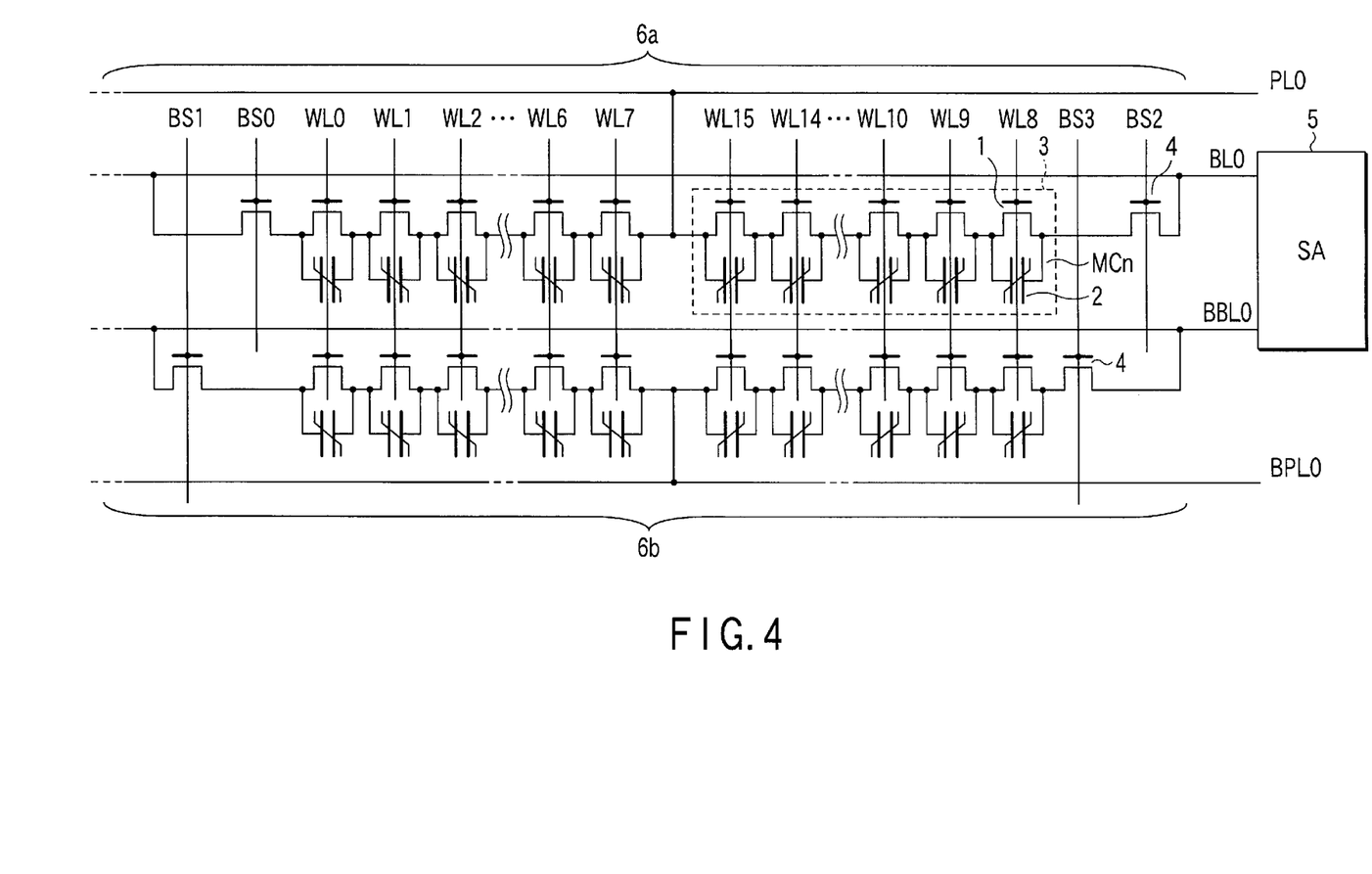
FIG. 4 is a circuit diagram showing the main part of the memory cell array of a series-connected TC parallel-unit type ferroelectric RAM according to a second embodiment of the present invention.

FIG. 4 shows the configuration of the main part of the memory array of a ferroelectric memory (series-connected TC parallel-unit type ferroelectric RAM) according to a second embodiment of the present invention. Explanation will be giving as to a case where a plate electrode wire is provided so as to correspond to a pair of bit lines (bit line pair) BL, BBL complementary to each other.

As shown in FIG. 4, a first memory block group 6a connected to bit line BL0 is connected to a first plate electrode wire PL0. A second memory block group 6b connected to bit line BBL0 is connected to a second plate electrode wire BPL0. That is, the configuration of the second embodiment differs from that of the first embodiment in that a pair of plate electrode wires (plate electrode wire pair) PL, BPL complementary to each other is provided separately for each memory block group 6 (6a, 6b).

Figure 5:
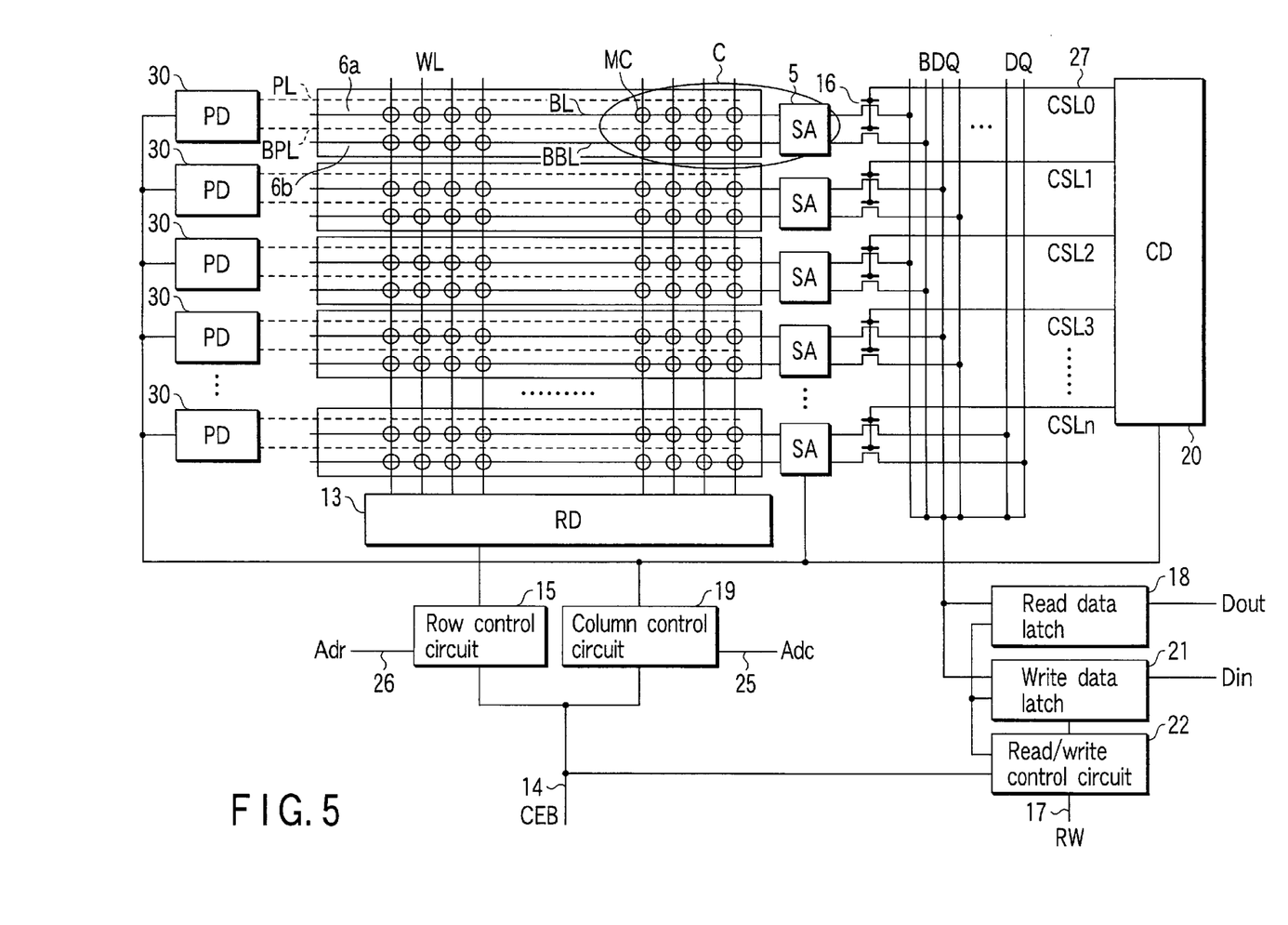
FIG. 5 shows the configuration of a series-connected TC parallel-unit type ferroelectric RAM with the array configuration shown in FIG. 4.

FIG. 5 shows an example of the configuration of a ferroelectric memory according to the second embodiment. The part denoted by C in FIG. 5 almost corresponds to the circuit of FIG. 4.

As shown in FIG. 5, each plate electrode wire driving circuit (PD) 30 is designed to drive a pair of plate electrode wires PL, BPL.

In the first embodiment, there is no problem in operating the cells as so-called two-transistor two-capacitor cells, where one of the two selected cells MC connected to a bit line pair of BL, BBL is in the "0" state and the other is in the "1", making complementary data. However, when the cells are operated as so-called one-transistor one-capacity cells, where the data in each memory cell MC connected to the corresponding bit lines BL, BBL is compared with a reference potential, the following problem arises.

During operation, the select word line WL is placed at the low level, the internal node of the memory cell MC connected to the reference potential is brought into the floating state. In this state, when the plate electrode wire PL is driven, a voltage is applied to the ferroelectric capacitors 2 of the memory cells MC connected to the unselected word lines WL, thus partially destroying the accumulated data.

To overcome this problem, plate electrode wire pairs PL, BPL are provided separately for the memory block group 6a on the bit line BL side and for the memory block group 6b on the bit line BBL side in the second embodiment. The plate electrode wire PL connected to the memory block group 6a or the plate electrode wire BPL connected to the memory block group 6b is designed to be driven by the corresponding plate electrode wire driving circuit 30.

With the second embodiment, even when the cells are operated as one-transistor one-capacitor cells, the accumulated data is prevented from being partially destroyed.

In addition to this, the second embodiment, of course, produces almost the same effect as the first embodiment.

(Third Embodiment)

As shown in the first and second embodiments, when a plate electrode wire and its driving circuit are provided for each bit line pair or each bit line, the number of accessed cells is decreased most. To make the overall layout of the ferroelectric memory smaller, for example, when a ferroelectric memory has a plurality of cell arrays 36 arranged on a semiconductor chip 35, a driving circuit for driving plate electrode wires can be shared in each cell array 36.

Figure 6A:
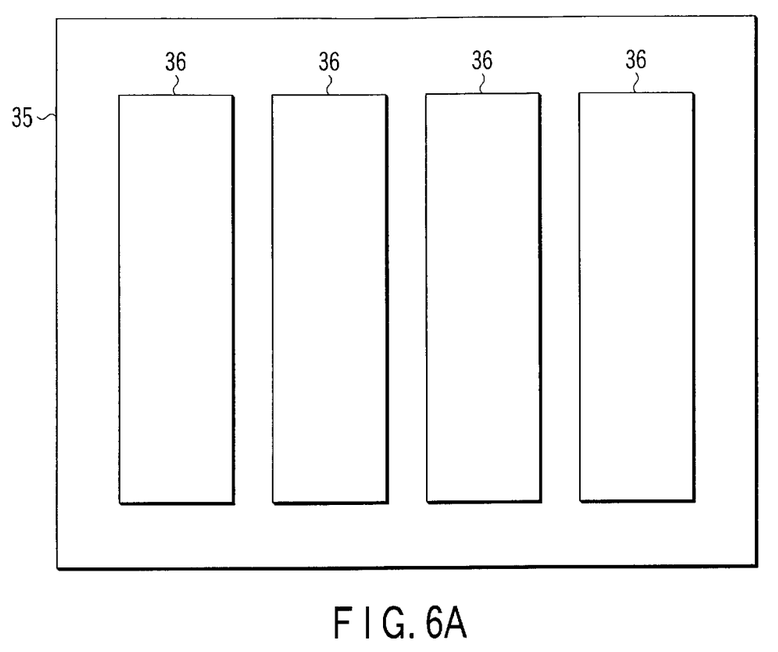
FIGS. 6A and 6B are diagrams each showing memory cell arrays of a series-connected TC parallel-unit type ferroelectric RAM according to a third embodiment of the present invention.

When a plurality of cell arrays 36 are arranged side by side in a row as shown in FIG. 6A, a delay difference due to the position of the bit line pair of BL, BBL can occur in the word line or the driving signal of the sense amplifier, depending on the capacity of the cell array 36. In this case, since an imbalance is liable to occur on the drive timing, this arrangement should be used for a small-capacity ferroelectric memory.

Figure 6B:
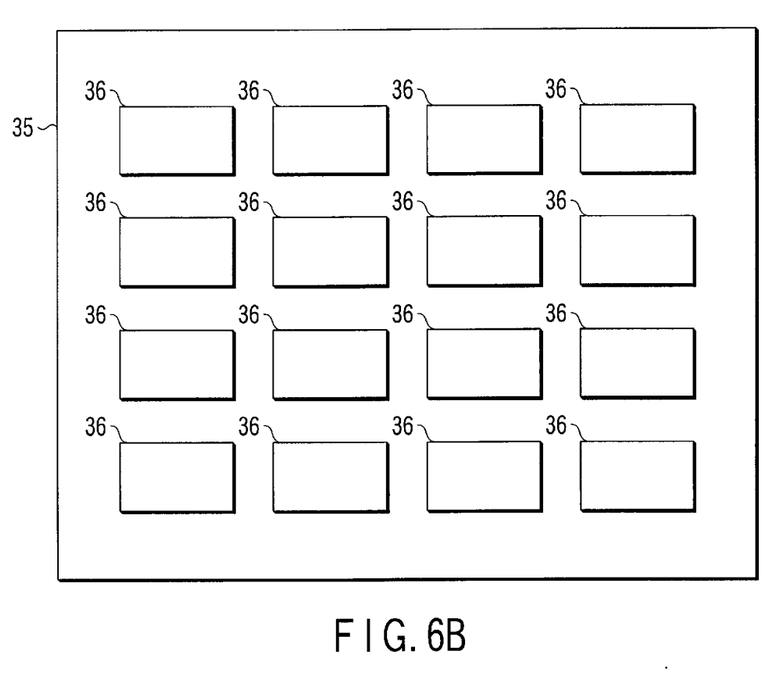

On the other hand, when a plurality of minimum cell arrays 36 are arranged in a matrix on a semiconductor chip 35 as shown in FIG. 6B, an imbalance on the drive timing is not liable to occur. For this reason, a large-capacity ferroelectric memory often has such a configuration which increases the number of divisions of the cell arrays 36 to make the capacity of each cell array 36 smaller.

Figure 7:
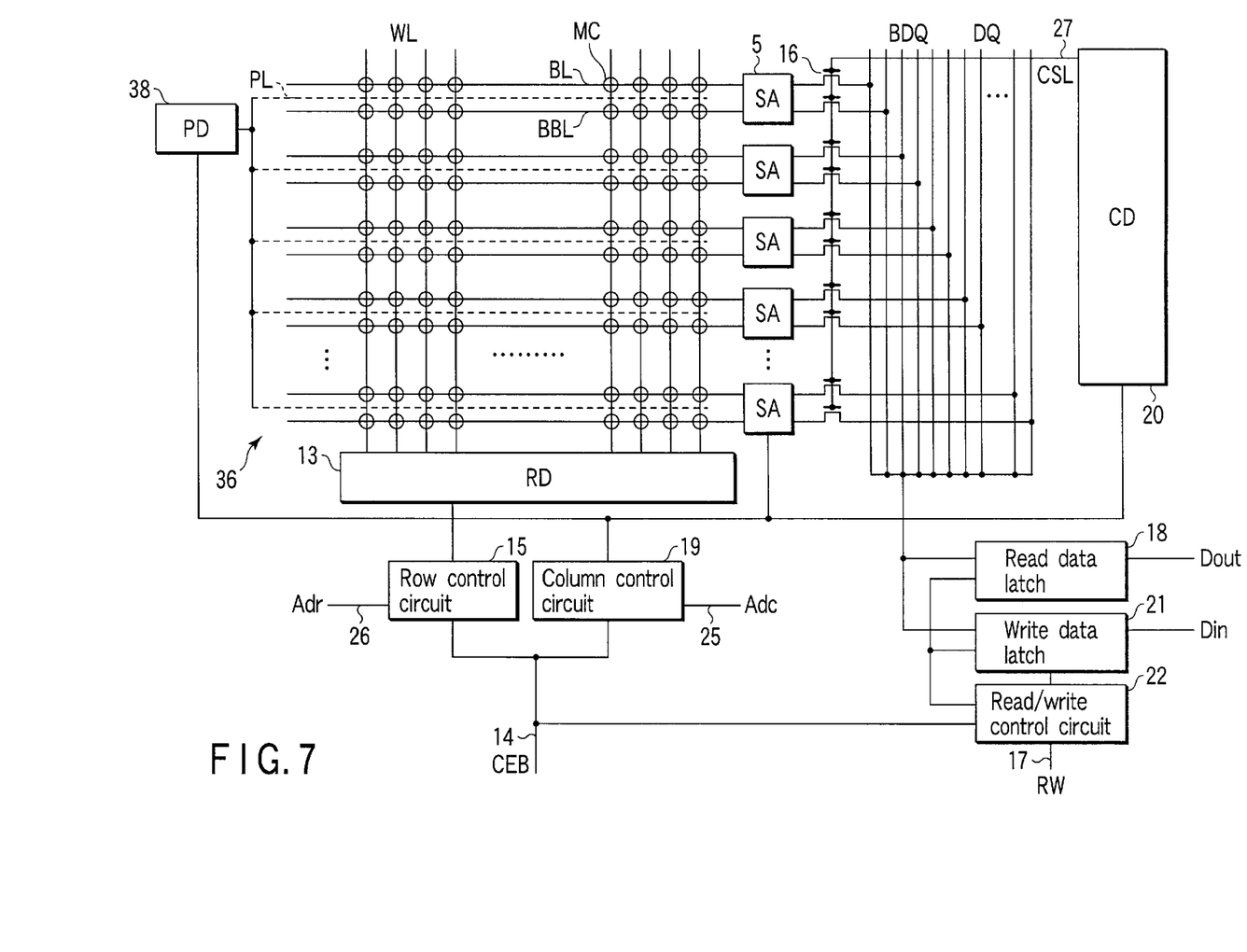
FIG. 7 shows the configuration of a series-connected TC parallel-unit type ferroelectric RAM according to the third embodiment.

FIG. 7 shows an example of the configuration of a ferroelectric memory (series-connected TC parallel-unit type ferroelectric RAM) according to the third embodiment. The third embodiment differs from the first embodiment in that one driving circuit (PD) 38 for the plate electrode wires PL and one column select line 27 are provided.

With this configuration, the plate electrode wires PL can be activated in cell arrays 36. As a result, as the area the plate electrode wire driving circuits 38 occupy is decreased thereby enabling a higher integration.

In addition to this, the third embodiment, of course, produces almost the same effect as the first embodiment.

(Fourth Embodiment)

Figure 8:
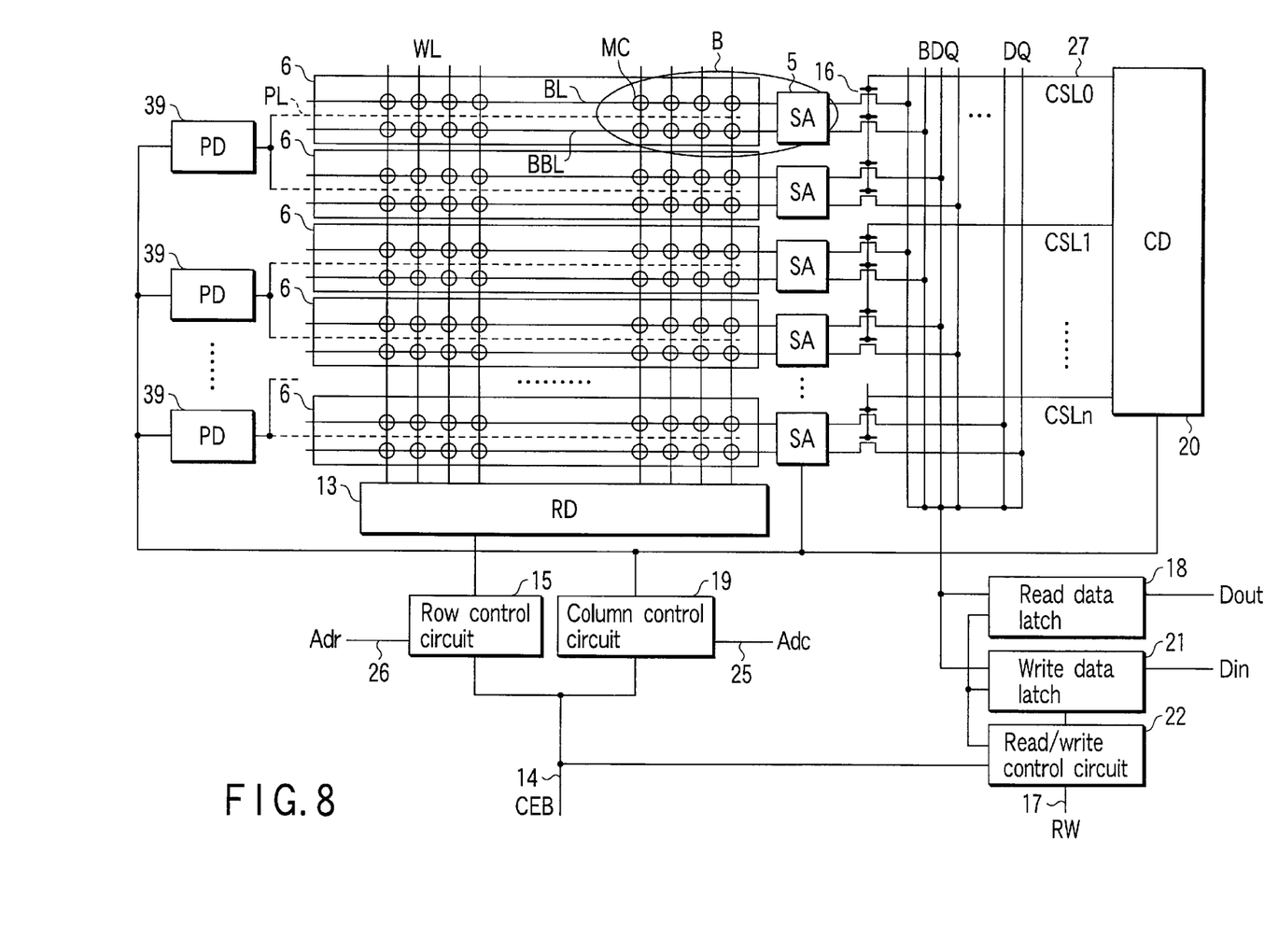
FIG. 8 shows the configuration of a series-connected TC parallel-unit type ferroelectric RAM according to a fourth embodiment of the present invention.

FIG. 8 shows an example of the configuration of a ferroelectric memory (series-connected TC parallel-unit type ferroelectric RAM) according to a fourth embodiment of the present invention. Explanation will be given as to a case where a plurality of bit line pairs BL, BBL share one plate electrode wire driving circuit (PD) 39 in a ferroelectric memory with the configuration of the first embodiment.

In FIG. 8, a plate electrode wire driving circuit 39 is provided for two memory block groups 6 activated at the same time. That is, each plate electrode wire driving circuit 39 is shared by a plurality of bit line pairs BL, BBL connected to a column select line 27 selected by the same address and further connected to a different data line pair of DQ, BDQ.

The sharing of one plate electrode wire driving circuit 39 is not limited to this. For instance, some adjacent memory block groups 6 may share one plate electrode wire driving circuit. Alternatively, some discrete memory block groups 6 may share one plate electrode wire driving circuit. That is, the plate electrode wire driving circuits can be shared for each column select line 27 that controls column select gates 16.

With this configuration, in a ferroelectric memory where a plurality of memory cells MC accessed at the same time exist over a plurality of memory blocks 6, the plate electrode wire driving circuits 39 can be shared suitably according to the pattern of memory cells MC accessed. This enables a much higher integration.

In addition to this, the fourth embodiment, of course, produces almost the same effect as the first embodiment.

As described above in detail, with the present invention, it is possible to provide a semiconductor memory device capable of reducing not only the number of accessed memory cells but also the power consumption. Furthermore, it is possible to provide a semiconductor memory device capable of preventing not only the half-selected cells from being read from but also read disturb from occurring.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a plurality of memory cell blocks each of which comprises a series connection of a plurality of memory cells, each cell being such that both electrodes of a ferroelectric capacitor are connected between the source and drain of each cell transistor;
    a plurality of bit lines each of which is connected to one end of said plurality of memory cell blocks; and
    a plurality of plate electrode wires each of which is provided in parallel with said plurality of bit lines and connected to the other end of said plurality of memory cell blocks, with said memory cell blocks connected to the same one of said plurality of bit lines being connected to the same one of said plurality of plate electrode wires.

2. The semiconductor memory device according to claim 1, further comprising a plurality of word lines each of which is connected to each gate of said each cell transistor, wherein, of said plurality of memory cells, only those connected to the plate electrode wire and word line set in the selected state are accessed.

3. The semiconductor memory device according to claim 2, wherein, of said plurality of memory cell blocks, a specific number of those connected to the same plate electrode wire and the same bit line constitute each memory block group.

4. The semiconductor memory device according to claim 1, wherein each of said plurality of bit lines comprises a pair of signal lines complementary to each other.

5. The semiconductor memory device according to claim 4, wherein at least two memory cell blocks are connected to each of said pair of signal lines.

6. The semiconductor memory device according to claim 1, wherein each of said plurality of plate electrode wires comprises a pair of signal lines complementary to each other.

7. A semiconductor memory device comprising:
    a plurality of memory cells having a plurality of cell transistors and a plurality of ferroelectric capacitors each of which is connected between the source and drain of each of said plurality of cell transistors;
    a plurality of memory cell blocks each of which comprises a series connection of a specific number of those of said plurality of memory cells;
    a plurality of bit lines each of which is connected via a select transistor to one end of said plurality of memory cell blocks;
    a plurality of plate electrode wires each of which is provided in parallel with said plurality of bit lines and connected to the other end of said plurality of memory cell blocks; and
    a plurality of memory block groups each of which comprises a specific number of those of said plurality of memory cell blocks connected to the same plate electrode wire and the same bit line.

8. The semiconductor memory device according to claim 7, further comprising a plurality of word lines each connected to each gate of said each cell transistors, wherein, of said plurality of memory cells, only those connected to the plate electrode wire and word line set in the selected state are accessed.

9. The semiconductor memory device according to claim 8, wherein said plurality of cell transistors are controlled by a signal controlled by a row address signal supplied to each of said plurality of word lines.

10. The semiconductor memory device according to claim 7, wherein each of said plurality of bit lines comprises a pair of signal lines complementary to each other.

11. The semiconductor memory device according to claim 10, wherein at least two memory cell blocks are connected to each of said pair of signal lines.

12. The semiconductor memory device according to claim 7, wherein a plurality of sense amplifiers for driving bit lines are additionally connected to said plurality of bit lines respectively.

13. The semiconductor memory device according to claim 12, wherein said plurality of sense amplifiers activate only the bit lines connected to the memory block group connected to the plate electrode wire set in the selected state.

14. The semiconductor memory device according to claim 12, wherein the activating operation of each of said plurality of sense amplifiers is controlled according to a column address signal.

15. The semiconductor memory device according to claim 7, wherein each of said plurality of plate electrode wires comprises a pair of signal lines complementary to each other.

16. The semiconductor memory device according to claim 7, wherein at least one plate electrode wire ax driving circuit is additionally connected to each of said plurality of plate electrode wires.

17. The semiconductor memory device according to claim 16, wherein said plate electrode wire driving circuit is provided for each of said plurality of plate electrode wires.

18. The semiconductor memory device according to claim 16, wherein said plate electrode wire driving circuit is shared by every specific number of those of said plurality of plate electrode wires.

19. The semiconductor memory device according to claim 16, wherein said plate electrode wire driving circuit is shared by all of said plurality of plate electrode wires.

20. The semiconductor memory device according to claim 16, wherein the activating operation of said plate electrode wire driving circuit is controlled according to a column address signal.

* * * * *

UNITED STATES PATENT AND TRADEMARK OFFICE
CERTIFICATE OF CORRECTION

PATENT NO.    : 6,366,490 B1
DATED         : April 2, 2002
INVENTOR(S)   : Yoshiaki Takeuchi et al.

It is certified that error appears in the above-identified patent and that said Letters Patent is hereby corrected as shown below:

<u>Column 14,</u>
Line 2, "ax" has been deleted.

Signed and Sealed this

Seventeenth Day of September, 2002

Attest:

JAMES E. ROGAN
Attesting Officer          Director of the United States Patent and Trademark Office